United States Patent
Millward

(10) Patent No.: US 8,562,844 B2
(45) Date of Patent: *Oct. 22, 2013

(54) METHODS USING BLOCK CO-POLYMER SELF-ASSEMBLY FOR SUB-LITHOGRAPHIC PATTERNING

(75) Inventor: Dan B. Millward, Boise, ID (US)

(73) Assignee: Micron Technology, Inc., Boise, ID (US)

(*) Notice: Subject to any disclaimer, the term of this patent is extended or adjusted under 35 U.S.C. 154(b) by 57 days.

This patent is subject to a terminal disclaimer.

(21) Appl. No.: 13/157,168

(22) Filed: Jun. 9, 2011

(65) Prior Publication Data

US 2011/0240596 A1 Oct. 6, 2011

Related U.S. Application Data

(63) Continuation of application No. 11/703,911, filed on Feb. 8, 2007, now Pat. No. 7,964,107.

(51) Int. Cl.
*H01L 21/302* (2006.01)
*B81C 1/00* (2006.01)

(52) U.S. Cl.
USPC ............ 216/17; 216/41; 216/49; 216/55; 216/58; 216/83; 438/694; 438/700; 438/947

(58) Field of Classification Search
None
See application file for complete search history.

(56) References Cited

U.S. PATENT DOCUMENTS

| | | | |
|---|---|---|---|
| 6,746,825 B2 | 6/2004 | Nealey et al. | |
| 6,926,953 B2 | 8/2005 | Nealey et al. | |
| 7,045,851 B2 | 5/2006 | Black et al. | |
| 7,605,081 B2 | 10/2009 | Yang et al. | |
| 7,883,930 B2 | 2/2011 | Tsukamoto et al. | |
| 8,215,074 B2* | 7/2012 | Black et al. | 52/506.07 |
| 8,226,838 B2* | 7/2012 | Cheng et al. | 216/41 |
| 2004/0124092 A1 | 7/2004 | Black et al. | |
| 2004/0142578 A1 | 7/2004 | Wiesner et al. | |
| 2006/0078681 A1* | 4/2006 | Hieda et al. | 427/307 |
| 2006/0134556 A1 | 6/2006 | Nealey et al. | |
| 2006/0163646 A1 | 7/2006 | Black et al. | |
| 2006/0249784 A1 | 11/2006 | Black et al. | |
| 2006/0261379 A1 | 11/2006 | Tsukamoto et al. | |
| 2007/0281220 A1 | 12/2007 | Sandhu et al. | |
| 2008/0176767 A1* | 7/2008 | Millward | 506/20 |
| 2008/0233323 A1 | 9/2008 | Cheng et al. | |
| 2008/0293183 A1 | 11/2008 | Tsukamoto et al. | |
| 2011/0232515 A1* | 9/2011 | Millward | 101/333 |

FOREIGN PATENT DOCUMENTS

| | | |
|---|---|---|
| JP | 2003-155365 | 5/2003 |
| JP | 2006-215052 | 8/2006 |
| JP | 2006/324501 | 11/2006 |
| JP | 2008-036491 | 2/2008 |

OTHER PUBLICATIONS

Black et al., "Nanometer-Scale Pattern Registration and Alignment by Directed Diblock Copolymer Self-Assembly", IEEE Transactions of Nanotechnology, Sep. 2004, 3(3):412-415.

(Continued)

*Primary Examiner* — Anita Alanko
(74) *Attorney, Agent, or Firm* — Wells St. John, P.S.

(57) ABSTRACT

Block copolymers can be self-assembled and used in methods as described herein for sub-lithographic patterning, for example. The block copolymers can be diblock copolymers, triblock copolymers, multiblock copolymers, or combinations thereof. Such methods can be useful for making devices that include, for example, sub-lithographic conductive lines.

23 Claims, 4 Drawing Sheets

(56) References Cited

OTHER PUBLICATIONS

Black, "Self-Aligned Self Assembly of Multi-Nanowire Silicon Field Effect Transistors", Appl. Phys. Lett., Oct. 17, 2005; 87(16):163116-1 to 163116-3. (Published online Oct. 13, 2005).

Park et al., "Directed Assembly of Lamellae-Forming Block Copolymers Using Chemically and Topographically Patterned Substrates", Advanced Materials, Feb. 2007; 1994):607-611. (Published online Jan. 26, 2007).

Ruiz et al., "Induced Orientational Order in Symmetric Diblock Copolymer Thin-Films", Advanced Materials, Feb. 2007; 19(4):587-591, (Published online Jan. 25, 2007).

Yamaguchi et al., "Resist-Pattern Guided Self-Assembly of Symmetric Diblock Copolymer", J. Photopolym Sci. & Tech., 2006; 19(3):385-388. no month available.

* cited by examiner

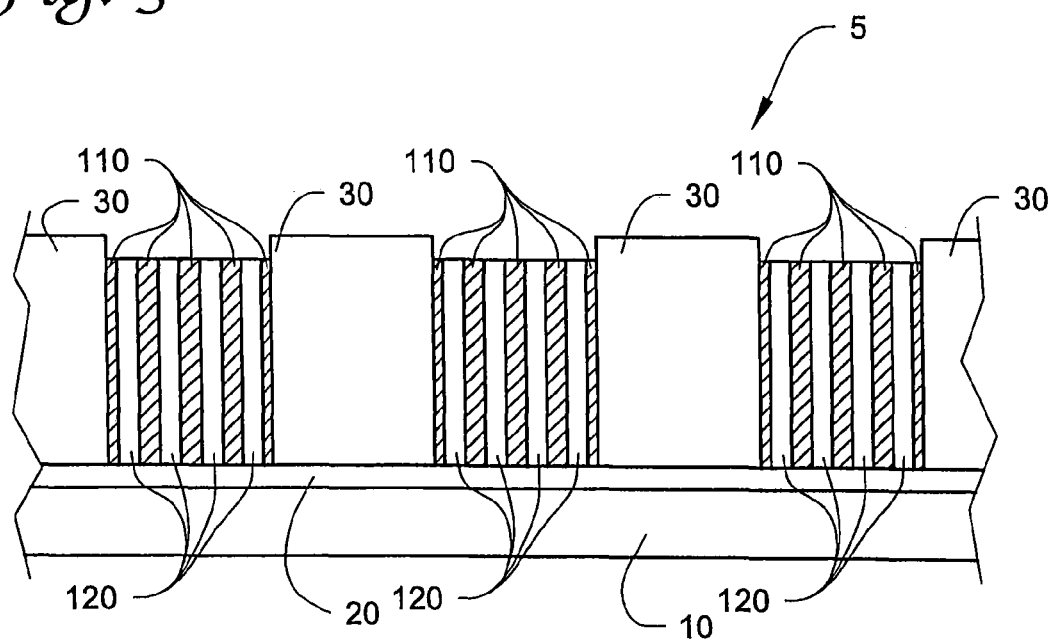
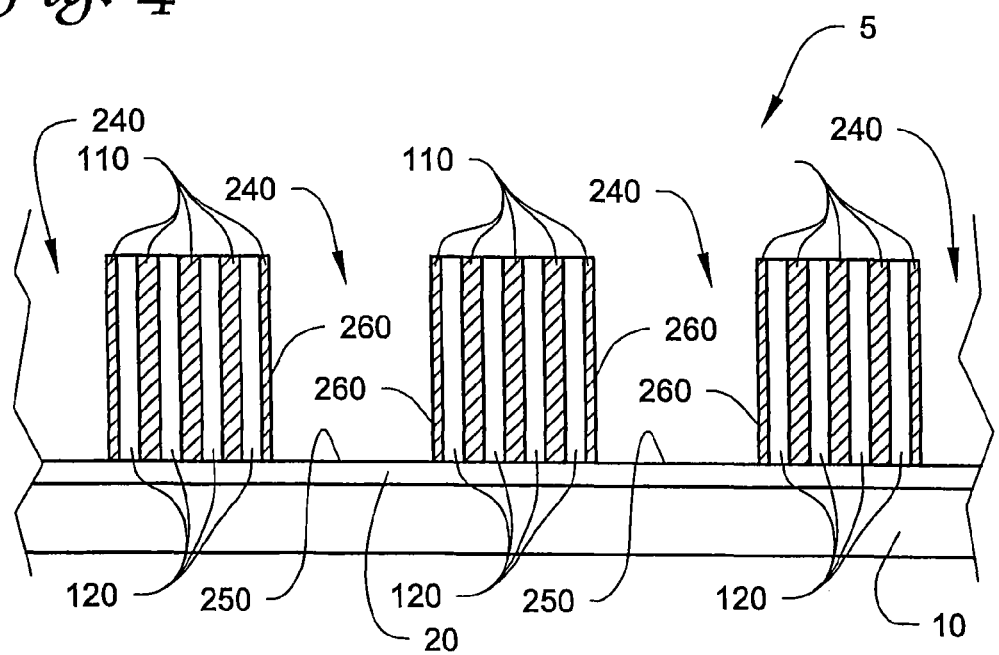

US 8,562,844 B2

METHODS USING BLOCK CO-POLYMER SELF-ASSEMBLY FOR SUB-LITHOGRAPHIC PATTERNING

RELATED PATENT DATA

This patent resulted from a continuation application of U.S. patent application Ser. No. 11/703,911, filed Feb. 8, 2007, entitled "Methods Using Block Co-Polymer Self-Assembly for Sub-Lithographic Patterning", naming Dan Millward as inventor, now U.S. Pat. No. 7,964,107, the disclosure of which is incorporated by reference.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory. Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

An increase in the performance and density of flash memory transistors is needed as the performance of computer systems increases. To accomplish the density and performance increase, the transistors have been reduced in size, resulting in increased speed with decreased power requirements. However, further reductions in size are often limited by the lower limit of dimensions that can be achieved using lithographic methods. For example, structures such as conductive lines having features (e.g., line width) of 57.5 nanometers (nm) or less are difficult to produce by standard lithographic methods, and are referred to herein as "sub-lithographic" features.

Attempts have been made to prepare sub-lithographic features by other methods known in the art. For example, electron beam (e-beam) lithography and extreme ultraviolet (EUV) lithography have been used in attempts to prepare such sub-lithographic features. Although such methods can be capable of preparing sub-lithographic features, widespread use of such methods has been hampered by difficulties including, for example, high costs and/or incompatibility with high throughput production methods.

For the reasons stated above, and for other reasons stated below which will become apparent to those skilled in the art upon reading and understanding the present specification, there is a need in the art for methods for preparing sub-lithographic features.

BRIEF DESCRIPTION OF THE DRAWING

FIG. 3 is a view of the FIG. 2 substrate at a processing step subsequent to that shown in FIG. 2.

FIG. 4 is a view of the FIG. 3 substrate at a processing step subsequent to that shown in FIG. 3.

DETAILED DESCRIPTION OF ILLUSTRATIVE EMBODIMENTS

Figure 1:
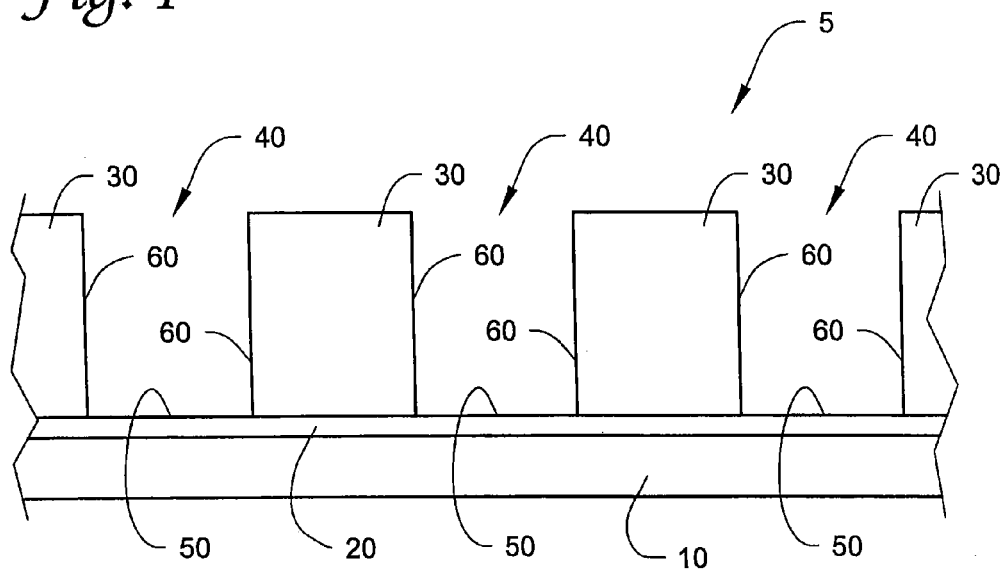
FIG. 1 is a diagrammatic cross sectional view of a substrate in process in accordance with an embodiment of the invention.

Self-assembly of block copolymers has been used to prepare features on substrates. See, for example, U.S. Pat. No. 7,045,851 B2 (Black et al.); U.S. Pat. Application Pub. Nos. 2004/0124092 A1 (Black et al.), 2004/0142578 A1 (Wiesner et al.), 2006/0134556 A1 (Nealey et al.), 2006/0163646 A1 (Black et al.), and 2006/0249784 A1 (Black et al.); Black, *IEEE Transactions on Nanotechnology*, 3:412-415 (2004); Black, *Applied Physics Letters*, 87: 163116, 1-3 (2005); and Yamaguchi et al., *Journal of Photopolymer Science and Technology*, 19:385-388 (2006). For example, lithographically derived trenches have been used as guides for self-assembly of block copolymers to provide sub-lithographic features. However, the maximum width of each lithographically derived trench is typically limited to a multiple (e.g., with an integer multiplier in certain embodiments) of the inherent periodicity ($L_o$) of the block copolymer, and typically limited to at most $3L_o$ to $15 L_o$. Thus, this limitation on the maximum width of each trench in effect limits the area of a substrate that can be patterned by such known methods using self-assembly of block copolymers. Methods described in certain embodiments of the present disclosure can be used for sub-lithographic patterning of larger areas of substrates compared to heretofore known patterning methods using self-assembly of block copolymers.

Certain embodiments of the present invention provide a method for sub-lithographic patterning of a substrate. In one embodiment, the method includes: providing a block copolymer having an inherent periodicity of $L_o$; providing a substrate including a plurality (e.g., two or more) of self-assembled copolymer defined trenches, wherein each trench of the plurality of trenches has a width of $nL_o$, wherein n can be from 1 to 15; depositing the block copolymer on the substrate surface; and annealing (e.g., thermal annealing and/or solvent annealing) the block copolymer to allow the block copolymer to self-assemble. In certain embodiments, annealing allows the block copolymer to self-assemble and form within each trench a set of lamellae that can be substantially perpendicular to the substrate surface and substantially in register with each trench sidewall. For such embodiments, a first portion of the set of lamellae can optionally be crosslinked (e.g., by exposure to ultraviolet radiation), wherein the crosslinked lamellae include a first block of the self-assembled block copolymer. Further, a second portion of the set of lamellae can optionally be selectively removed, wherein the removed lamellae include a second block of the self-assembled block copolymer. The resulting structure can be used, for example, as an etch mask and/or a deposition mask. For example, in one embodiment the substrate surface can be etched using the crosslinked lamellae as an etch mask, any remaining polymeric material can optionally be removed, and conductive material (e.g., a metal-containing material, a conductive polymer, and/or a metal-containing polymer composite) can be deposited in the sub-lithographic trenches to form sub-lithographic conductive lines. In another embodiment, the substrate surface can be etched using the crosslinked lamellae as an etch mask, any remaining polymeric material can optionally be removed, and insulating material (e.g., non-conductive material having a high or low dielectric constant, and in certain embodiments a low dielectric constant to minimize capacitative coupling) can be deposited in the sub-lithographic trenches, for example, to isolate active areas from one another. As used herein, a high dielectric constant (high-k) material is considered to have a dielectric constant that is greater than that of silicon dioxide (i.e., k=3.9), and a low dielectric constant (low-k) material is considered to have a dielectric constant that is less than or equal to that of silicon dioxide (i.e., k=3.9). Alternatively, for embodiments in which the crosslinked lamellae are metal-containing lamellae, the resulting structure can include conductive lines. One or more additional layers can optionally be provided to form a device in which the conductive lines are, for example, transistor gates.

Certain embodiments of the present invention provide a method for patterning a substrate. In one embodiment, the method includes providing a substrate having a surface including a plurality of spacers (or hereinafter "weirs") of height Y to form a surface topography of weirs and trenches; providing a first block copolymer having an inherent periodicity of $L_o$; and providing a second block copolymer having an inherent periodicity of $L'_o$.

A substrate having such surface topography can be prepared using, for example, lithographic methods. In certain embodiments, the substrate having such surface topography can be prepared by a method that includes, for example, depositing a resist (e.g., an e-beam resist and/or a photoresist) on a substrate surface to form a layer of thickness Y, wherein the substrate has a surface (e.g., a hydrogen-terminated silicon, a crosslinked polymer mat, and/or a grafted polymer) that is neutral-wetting (i.e., no substantial difference in wetting) with respect to each block of the first block copolymer; exposing the resist to form a pattern of lines; and selectively removing either the exposed or unexposed portion of the resist to form a plurality of trenches of width $nL_o$, wherein n can be from 1 to 15. The resist remaining on the substrate surface can be selectively wetted by one block (i.e., wetted by one block and not substantially wetted by other blocks) of the first block copolymer. Thus, in such an embodiment, each trench has a floor that is neutral-wetting with respect to each block of the first block copolymer and two sidewalls that are selectively wetted by one block of the first block copolymer. In another embodiment, the substrate having such surface topography can be prepared by a method that includes, for example, providing a substrate (e.g., a semiconductor substrate or substrate assembly) having a surface; depositing a layer (e.g., a silicon-containing layer) of thickness Y on the substrate surface; and selectively etching the layer to form a topography of weirs and trenches of width $nL_o$, wherein n can be from 1 to 15. Optionally, the method can further include, either before or after depositing the layer of thickness Y on the substrate surface (and in certain embodiments before), depositing a neutral-wetting polymer mat on the substrate surface and crosslinking the polymer mat. Optionally, the method can further include grafting a neutral-wetting polymer to the substrate surface before depositing the layer of thickness Y on the substrate surface, and/or in certain embodiments, selectively grafting a neutral-wetting polymer to the substrate surface after depositing the layer of thickness Y on the substrate surface (e.g., selectively grafting the neutral-wetting polymer to the floor of the trench).

The first block copolymer having an inherent periodicity of $L_o$ and the second block copolymer having an inherent periodicity of $L'_o$ can each independently be diblock copolymers, triblock copolymers, multiblock copolymers, or combinations thereof, all of which in certain embodiments can self-assemble in a lamellar morphology. The inherent periodicities $L_o$ and $L'_o$ can be the same or different. In certain embodiments, $L_o$ and $L'_o$ can each independently be from 10 nanometers to 100 nanometers. The first and second block copolymers can be the same or different. For some embodiments at least one, and in certain embodiments both, of the first and second block copolymers can be substantially symmetric diblock copolymers.

The method for patterning the substrate further includes: depositing the first block copolymer on the substrate surface to form a layer of thickness less than or equal to Y; annealing the first block copolymer layer to allow the first block copolymer to self-assemble and form within each trench a first set of lamellae that can be substantially perpendicular to the substrate surface and substantially in register with each trench sidewall; crosslinking a portion of the first set of lamellae that includes a first block of the self-assembled first block copolymer; and removing at least a portion of material forming the weirs to form at least one opening having a depth of Y'. The at least one opening has a floor that is neutral-wetting with respect to each block of the second block copolymer; two sidewalls that are selectively wetted by one block of the second block copolymer; and a width of $mL'_o$, wherein m can be from 1 to 15. The method further includes depositing the second block copolymer on the substrate surface to form a layer of thickness less than or equal to Y'; and annealing the second block copolymer layer to allow the second block copolymer to self-assemble and form within the at least one opening a second set of lamellae that can be substantially perpendicular to the substrate surface and substantially in register with each opening sidewall. In certain embodiments, the method can further include crosslinking a first portion of the second set of lamellae, wherein the crosslinked lamellae include a first block of the self-assembled second block copolymer. Further, a second portion of the first and/or second set of lamellae, and in certain embodiments both, can optionally be selectively removed, wherein the removed lamellae include a second block of the self-assembled first and/or second block copolymer. The resulting structure can be used, for example, as an etch mask and/or a deposition mask. Alternatively, for embodiments in which at least some of the crosslinked lamellae are metal-containing lamellae, the resulting structure can include conductive lines.

In certain embodiments, methods as disclosed herein can be used for sub-lithographic patterning of a substrate without the need for techniques such as interferometry, e-beam lithography, or EUV lithography, which can be expensive and/or unpractical for high throughput production methods. See, for example, U.S. Pat. Nos. 6,746,825 B2 (Nealey et al.) and 6,926,953 B2 (Nealey et al.). Further, for certain embodiments, methods as disclosed herein can be used for sub-lithographic patterning of larger areas of substrates compared to heretofore known patterning methods using self-assembly of block copolymers.

As used herein, "metal-containing" is used to refer to a material, typically a compound or a layer, that may consist entirely of a metal, or may include other elements in addition to a metal. Typical metal-containing compounds include, but are not limited to, metals, metal-ligand complexes, metal salts, organometallic compounds, and combinations thereof.

Typical metal-containing layers include, but are not limited to, metals, metal oxides, metal silicates, and combinations thereof.

As used herein, the term "(meth)acrylate" is a shorthand reference to acrylate, methacrylate, or combinations thereof.

As used herein, "sublithographic" is used to refer to structures having one or more sizes or dimensions that are less than the minimum photolithography feature size. For example, "sublithographic lines" are used herein to refer to lines having a width of 57.5 nm or less.

As used herein, "a," "an," "the," and "at least one" are used interchangeably and mean one or more than one.

As used herein, the term "or" is generally employed in the sense as including "and/or" unless the context of the usage clearly indicates otherwise.

Also herein, the recitations of numerical ranges by endpoints include all numbers subsumed within that range (e.g., 1 to 5 includes 1, 1.5, 2, 2.75, 3, 3.80, 4, 5, etc.).

As used herein, the term "comprising," which is synonymous with "including" or "containing," is inclusive, open-ended, and does not exclude additional unrecited elements or method steps.

The above brief description of various embodiments of the methods as described herein is not intended to describe each embodiment or every implementation of such methods. Rather, a more complete understanding of the methods as described herein will become apparent and appreciated by reference to the following description and claims in view of the accompanying drawing. Further, it is to be understood that other embodiments may be utilized and structural changes may be made without departing from the scope of the present disclosure.

The methods described herein include block copolymers, which are polymers that include one or more long sequences (i.e., "blocks") of the same monomeric unit(s) covalently bound to one or more long sequences (i.e., "blocks") of unlike type, e.g., including differing monomeric unit(s). Block copolymers are typically named using the word "-block-" or a "-b-" to separate each monomeric unit, while random copolymers are typically named using the word "-random-" or an "-r-" to separate each monomeric unit. A wide variety of block copolymers can be used in the methods described herein. For example, the block copolymers used herein can include diblock copolymers (i.e., copolymers having two blocks), triblock copolymers (i.e., copolymers having three blocks), multiblock copolymers (i.e., copolymers having more than three blocks), and combinations thereof. For methods that include a first and a second block copolymer, the first block copolymer can be the same as or different than the second block copolymer.

Diblock copolymers can be used for certain embodiments of methods as described herein. Diblock copolymers can be substantially symmetric (i.e., the volume fraction of the first block is substantially the same as the volume fraction of the second block) or unsymmetric (i.e., the volume fraction of the first block is substantially different than the volume fraction of the second block). As used herein, each block of a substantially symmetric diblock copolymer has a volume fraction of from 0.4 to 0.6. As used herein, each block of an unsymmetric diblock copolymer has a volume fraction of less than 0.4 or greater than 0.6. Substantially symmetric diblock copolymers can be used for embodiments in which the diblock copolymer self-assembles to form lamellae (i.e., sheets of one material interleaved with another material), unsymmetric diblock copolymers can be used for embodiments in which the diblock copolymer self assembles to form other structures including, for example, spheres, cylinders, gyroids, or combinations thereof. For methods that include a first and a second block copolymer, both the first and the second block copolymers can be substantially symmetric diblock copolymers.

Each block of a block copolymer can assemble into a domain during self-assembly. For example, substantially symmetric diblock copolymers can self-assemble into lamellar structures in which alternating lamellae each represent a domain that includes one block of the diblock copolymer. Further, the distance between the middle of a first lamella and the middle of the next lamella of the same type (provided that neither lamella is at the boundary of the series of lamellae) is the inherent periodicity ("$L_o$"), which can be dependent on the length and/or molecular weight of the polymer chain for each block. Thus, the inherent periodicity can be increased by increasing the length and/or molecular weight of the polymer chain for one or both blocks of a diblock copolymer, provided that the volume fraction of each block remains from 0.4 to 0.6 for lamellar morphologies. Similarly, the inherent periodicity can be decreased by decreasing the length and/or molecular weight of the polymer chain for one or both blocks of a diblock copolymer. Diblock copolymers used in methods as described herein typically have an inherent periodicity ($L_o$) of from 10 nanometers to 100 nanometers. For methods that include a first and a second block copolymer, the inherent periodicity of the first block copolymer can be the same as or different than the inherent periodicity of the second block copolymer, provided that the volume fraction of each block remains from 0.4 to 0.6 for lamellar morphologies.

For certain embodiments, each block of a block copolymer used in methods as described herein can differ from other blocks in the copolymer not only in terms of the structure of monomeric units that form the block, but also in other properties including, for example, physical properties (e.g., mechanical strength, surface tension, wettability, and/or solubility) and chemical properties (e.g., solubility, chemical reactivity, susceptibility to removal techniques, and/or susceptibility to crosslinking reactions). For some embodiments, a block can include a small portion (e.g., 5 mole % or less) of units formed from crosslinkable monomers. In certain embodiments, the non-crosslinkable and crosslinkable units can have similar physical and chemical properties.

Example diblock copolymers include polystyrene-b-polymethylmethacrylate block copolymers, polyethyleneoxide-b-polyisoprene block copolymers, polyethyleneoxide-b-polybutadiene block copolymers, polyethyleneoxide-b-polystyrene block copolymers, polyethyleneoxide-b-polymethylmethacrylate block copolymers, polystyrene-b-polyvinylpyridine block copolymers, polystyrene-b-polyisoprene block copolymers, polystyrene-b-polybutadiene block copolymers, polybutadiene-b-polyvinylpyridine block copolymers, polyisoprene-b-polymethylmethacrylate block copolymers, and combinations thereof. For some embodiments of methods as described herein, a polystyrene-b-polymethylmethacrylate diblock copolymer can be used for some or all of the block copolymers used in the method.

Example triblock and/or multiblock copolymers include block copolymers having three or more blocks selected from the group consisting of polystyrenes, polyalkyl(meth)acrylates (e.g., polymethylmethacrylate), polyalkyleneoxides (e.g., polyethyleneoxide), polyolefins (e.g., polyisoprene and polybutadiene), polyvinylpyridines, and combinations thereof.

Block copolymers can be deposited on a surface (e.g., a substrate surface) by methods that are well known to one of skill in the art. As used herein, "deposited on" a surface is intended to be broadly interpreted to include any suitable means of applying the block copolymer to the surface including, for example, deposition methods, coating methods, transfer methods, and/or other available application methods. Example deposition methods include, but are not limited to, spin coating, dip coating, spray coating, and combinations thereof. In such methods, the block copolymer can typically be dissolved, dispersed, or suspended in a medium (e.g., a solvent); the solution, dispersion, or suspension can be deposited on the surface, and the medium can optionally be removed (e.g., through evaporation at ambient or elevated temperature, and at ambient or reduced pressure) during or subsequent to deposition.

Once the block copolymer has been deposited on a surface, the block copolymer can be annealed to break up any existing domains and allow the block copolymer to self-assemble. Useful annealing methods include thermal annealing, solvent annealing, and combinations thereof. Annealing can include exposing the block copolymer to a temperature of from 0° C. to 250° C. for up to 24 hours or longer, and in certain embodiments under a vacuum and/or an oxygen-free atmosphere. Thermal annealing typically includes exposing the block copolymer to an elevated temperature (e.g., at or above the glass transition temperature), and lowering the temperature to allow the self-assembled block copolymer to harden. Solvent annealing can include exposing the block copolymer to vapors of a solvent that solvates each block of the block copolymer; allowing the block copolymer to swell (and in certain embodiments become plasticized); and then removing at least a portion of the solvent, for example, through evaporation (and in certain embodiments allowing plasticizer to separate as the blocks phase separate, and removing at least a portion of the separated plasticizer).

The following example is offered to further illustrate various specific embodiments and techniques of the present disclosure. It should be understood, however, that many variations and modifications understood by those of ordinary skill in the art may be made while remaining within the scope of the present disclosure. Therefore, the scope of the present disclosure is not intended to be limited by the following example.

In certain embodiments as described herein, a block copolymer can be deposited on a surface having one or more trenches or openings to form a layer of block copolymer within the one or more trenches or openings. An illustrative device 5 is illustrated in FIG. 1. The device includes substrate 10, weirs 30, and trenches 40 forming a topography of weirs and trenches.

The one or more trenches or openings can be used as guides for the block copolymer to self-assemble within the one or more trenches or openings. Each trench or opening can be, for example, lithographically defined or self-assembled copolymer defined, both of which are described in further detail hereinafter. For trenches or openings in which one or both sidewalls are not perpendicular to the surface, the width of the trench or opening as referred to herein can be taken as the average of the width at the bottom of the trench or opening (i.e., the floor width) and the width at the top of the trench or opening. In some embodiments, the width of the trench or opening can be a multiple (or near multiple), n, of the inherent periodicity ($L_o$) of the block copolymer, where n can be from 1 to 15, and in certain embodiments an integer from 1 to 15. An increase in defects in lamellar morphology is typically observed as the trench width varies significantly from a multiple of $L_o$.

In certain embodiments, floor 50 of each trench or opening 40 can be neutral-wetting (i.e., no substantial difference in wetting) with respect to each block of the block copolymer. In certain embodiments, both sidewalls 60 of each trench or opening 40 can be selectively wetted by one block of the block copolymer. Selective wetting results from the difference in interfacial energies between the sidewall surface and each block of the block copolymer. This difference in interfacial energy can be due to the chemical composition of each material (e.g., structures that favor hydrogen bonding).

Figure 2:
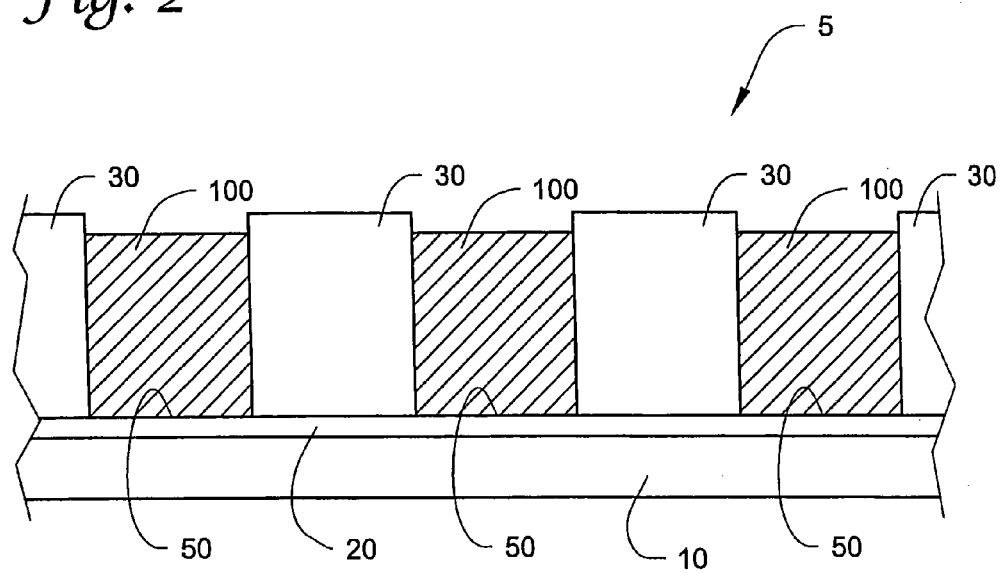
FIG. 2 is a view of the FIG. 1 substrate at a processing step subsequent to that shown in FIG. 1.

Referring to FIGS. 1 and 2, in certain embodiments, a substantially symmetric diblock copolymer 100 having an inherent periodicity of $L_o$ can be deposited within a trench or opening 40 (e.g., the copolymer layer is less than or equal to the depth of trench or opening), wherein floor 50 of trench or opening 40 is neutral-wetting with respect to each block of block copolymer 100, and both sidewalls 60 of trench or opening 40 are selectively wetted by one block of block copolymer 100.

Referring to FIG. 3, the deposited copolymer 100 can then be annealed to allow the diblock copolymer to self-assemble and form within each trench a set of alternating lamellae 110 and 120 that are substantially perpendicular to the surface and substantially in register with each trench sidewall. As used herein, "substantially perpendicular" lamellae refers to a set of lamellae that are, on average, perpendicular to the surface. As used herein, lamellae that are "substantially in register" with a trench sidewall refers to lamellae that are parallel to the sidewall (i.e., positioned at a constant distance from the sidewall) over a trench length of at least 10 micrometers. FIGS. 1 to 3 illustrate an embodiment in which n=4 (i.e., the width of each trench 40 is $4L_o$), and thus, 4 periods of lamellae are shown. However, as discussed herein above, n can be from 1 to 15, and accordingly from 1 to 15 periods of lamellae would result in these embodiments.

In certain embodiments, lamellae 110 that include a first block of the self-assembled block copolymer can optionally be crosslinked, for example, by exposure to radiation, e.g., ultraviolet (UV) radiation. In some embodiments, the block of the block copolymer being crosslinked can be susceptible to crosslinking without the addition of crosslinking agent. For example, if the block copolymer is a polystyrene-b-polymethylmethacrylate diblock copolymer, the polystyrene block can be crosslinked by exposure to UV radiation. For further examples, one block of the block copolymer can be made thermally crosslinkable by including a small amount (e.g., 0.1 to 5 mole %) of a thermally crosslinkable monomer (e.g., a benzocyclobutane-containing monomer) and/or made photochemically crosslinkable by including a small amount (e.g., 0.1 to 5 mole %) of a photochemically crosslinkable monomer (e.g., divinyl benzene) in the block of the copolymer. In certain other examples, one block of the block copolymer can be made thermally and/or photochemically crosslinkable by including a small amount (e.g., 0.1 to 5 mole %) of a thermally and/or photochemically crosslinkable monomer (e.g., para-azidomethylstyrene). Alternatively, or in addition to, in some embodiments, cross linking agents can be added to the lamellae that are to be crosslinked. A wide variety of crosslinking agents are known in the art and include, for example, the combination of a crosslinker (e.g., 1,3,5-trimethyl-2,4,6-(triacetoxymethyl)-benzene) and a thermal acid generator (e.g., cyclohexyl-methyl(2-oxocyclohexyl)sulfonium trifluoromethanesulfonate). Crosslinked lamellae can have, for example, improved mechanical properties and lower susceptibility to removal.

Remaining uncrosslinked lamellae 120 can optionally be selectively removed (not illustrated in FIG. 3), subsequent to crosslinking in certain embodiments, leaving the crosslinked lamellae 110 on the surface, although removal of uncrosslinked lamellae at this stage can, in certain embodiments, result in filling of such newly formed trenches with a second block copolymer when it is subsequently deposited. A wide variety of methods for removing uncrosslinked lamellae are known in the art including, for example, irradiation (e.g., UV or electron beam), ozone treatment, wet chemical processing methods such as immersion in a solvent, and/or etching methods such as reactive ion etching and ion beam etching. For example, when the block copolymer is a polystyrene-b-polymethylmethacrylate diblock copolymer and the lamellae including the polystyrene block are crosslinked, the remaining lamellae including the uncrosslinked polymethylmethacrylate block can be selectively removed, for example, by acetic acid development, and in certain embodiments after a blanket exposure to ultraviolet (UV) radiation.

In certain embodiments of methods as described herein, a substrate can include a plurality of lithographically derived trenches, each of which can serve as a guide for block copolymer self-assembly within each trench. Substrates (e.g., semiconductor substrates or substrate assemblies) including lithographically derived trenches can be prepared by methods well known in the art including, for example, resist technology and etching technology. "Semiconductor substrate" or "substrate assembly" as used herein refers to a semiconductor substrate such as a base semiconductor layer or a semiconductor substrate having one or more layers, structures, or regions formed thereon. A base semiconductor layer typically can be the lowest layer of silicon material on a wafer or a silicon layer deposited on another material, such as silicon on sapphire. When reference is made to a substrate assembly, various process steps may have been previously used to form or define regions, junctions, various structures or features, and openings such as transistors, active areas, diffusions, implanted regions, vias, contact openings, high aspect ratio openings, capacitor plates, barriers for capacitors, etc.

Referring to FIG. 1, in certain embodiments, the substrate surface can be modified by depositing a polymer mat or brush 20 on the substrate surface and crosslinking the polymer mat. The polymer mat can be crosslinked using the same method or a method different than that used to crosslink at least one block of the block copolymer. In certain embodiments, the same method can be used to crosslink the polymer mat and at least one block of the block copolymer. In certain embodiments, the polymer mat can be deposited on the substrate surface before depositing the layer of thickness Y on the substrate surface as described herein below. The crosslinked polymer mat can be used, for example, to make the substrate surface, which will become the floor of a trench or opening, neutral-wetting with respect to each block of a block copolymer that will be self-assembled on the substrate surface. For example, if the block copolymer is a polystyrene-b-polymethylmethacrylate diblock copolymer, a crosslinkable polystyrene-r-polymethylmethacrylate random copolymer can be used as the polymer mat.

In certain embodiments, polymer mat 20 can be crosslinked, for example, by exposure to radiation, e.g., ultraviolet (UV) radiation. In some embodiments, the polymer mat being crosslinked can be susceptible to crosslinking without the addition of crosslinking agent. For example, if the polymer mat is a polystyrene-r-polymethylmethacrylate random copolymer, the polystyrene in the random copolymer can be a crosslinking site upon exposure to UV radiation. For further examples, the polymer mat can be made crosslinkable by including a small amount (e.g., 0.1 to 5 mole %) of a thermally crosslinkable monomer (e.g., a benzocyclobutane-containing monomer) or a photochemically crosslinkable monomer (e.g., divinyl benzene and/or para-azidomethylstyrene) in the polymer mat. In certain other examples, the polymer mat can be made thermally and/or photochemically crosslinkable by including a small amount (e.g., 0.1 to 5 mole %) of a thermally and/or photochemically crosslinkable monomer (e.g., para-azidomethylstyrene). Alternatively, or in addition to, in some embodiments, crosslinking agents can be added to the polymer mat. A wide variety of crosslinking agents are known in the art and include, for example, the combination of a crosslinker (e.g., 1,3,5-trimethyl-2,4,6-(triacetoxymethyl)benzene) and a thermal acid generator (e.g., cyclohexylmethyl(2-oxocyclohexyl)sulfonium trifluoromethanesulfonate). In certain embodiments, the crosslinked polymer mat can have resistance adequate to withstand further processing steps encountered during the block copolymer self-assembly process.

Alternatively, in certain embodiments, the substrate surface can be modified by preparing a hydrogen-terminated silicon surface. For example, a silicon substrate having thereon a layer of oxide of thickness Y can be etched (e.g., with a plasma etch) to form trenches having a depth of Y' that is less than Y. The remaining oxide, having a thickness Y minus Y', on the silicon substrate can be removed (e.g., with a fluoride ion etch, which also removes native oxide on the silicon substrate), leaving a hydrogen-terminated silicon surface. The hydrogen-terminated silicon surface can be used, for example, to make the substrate surface, which will become the floor of a trench or opening, neutral-wetting with respect to each block of a block copolymer that will be self-assembled on the substrate surface. For example, if the block copolymer is a polystyrene-b-polymethylmethacrylate diblock copolymer, the hydrogen-terminated silicon surface can be neutral-wetting with respect to both blocks of the block copolymer.

In another embodiment, neutral-wetting random copolymers can be grown and grafted in situ from a hydrogen-terminated silicon surface (e.g., substrate surface). For example, a solution containing monomers (e.g., styrene, methylmethacrylate, and divinylbenzene in the ratio 58 to 42 to <5, respectively) and a radical initiator (e.g., benzoyl peroxide) can be placed over a hydrogen-terminated silicon surface and heated to initiate free radical polymerization, resulting in a neutral-wetting polymer grafted to the silicon surface.

In certain embodiments, a substrate including a plurality of lithographically derived trenches can be prepared using resist technology. For example, referring to FIG. 1, a substrate having a surface including a plurality of weirs 30 and trenches 40 can be prepared by the following method. A resist (e.g., a positive or negative resist) can be deposited on a substrate surface to form a layer of thickness Y and exposed to form a pattern of lines. Either the exposed or unexposed portion of the resist can be selectively removed to form a topography of weirs 30 and trenches 40. In certain embodiments, the substrate has a surface 50 that is neutral-wetting with respect to each block of the block copolymer. In certain embodiments, the resist remaining on the substrate surface (i.e., weirs 30) is selectively wetted by one block of the block copolymer. The resist can be, for example, a photoresist or an electron-beam (e-beam) resist.

A wide variety of photoresists can be used including, for example, polystyrene based resists, poly(meth)acrylate based resists, and combinations thereof. For example, if the block copolymer that will be self-assembled in the trench is a polystyrene-b-polymethylmethacrylate diblock copolymer, a polystyrene based resist can be used to create trenches with sidewalls that are selectively wetted by the polystyrene block of the block copolymer; or a poly(meth)acrylate based resist can be used to create trenches with sidewalls that are selectively wetted by the polymethylmethacrylate block of the block copolymer.

E-beam resists that are known in the art include, for example, hydrogen silsesquioxane based resists, polymethylmethacrylate-based resists, polystyrene-based resists (e.g., including derivatized polystyrene-based resists), and combinations thereof.

In certain embodiments, the resist can form a metal-containing layer (e.g., an aluminum nitride layer). In other certain embodiments, the resist can form a silicon-containing layer, and the trenches would include sidewalls having a silicon-containing surface. The silicon-containing layer or surface can be a silicon oxide ($SiO_2$) layer, a silicon nitride ($Si_3N_4$) layer, a silicon oxycarbide ($SiO_4C$) layer, or a combination thereof. Optionally, a homopolymer of one block of the block copolymer can be grafted to the silicon-containing surface of both sidewalls to provide trenches with sidewalls that are selectively wetted by the block of the block copolymer that is the same as or similar to the grafted homopolymer on the sidewalls. For example, if the block copolymer that will be self-assembled in the trench is a polystyrene-b-polymethylmethacrylate diblock copolymer, a polystyrene homopolymer can be grafted to the silicon-containing surface of both sidewalls to provide trenches with sidewalls that are selectively wetted by the polystyrene block of the block copolymer; or a polymethylmethacrylate homopolymer can be grafted to the silicon-containing surface of both sidewalls to provide trenches with sidewalls that are selectively wetted by the polymethylmethacrylate block of the block copolymer. The homopolymers can be grafted by a wide variety of methods known in the art including, for example, preparing homopolymers with end groups (e.g., hydroxyl groups) and/or including a small amount (e.g., 0.1 to 5 mole %) of a hydroxyl-functional monomer (e.g., 2-hydroxyethylmethacrylate and/or para-hydroxystyrene) in the homopolymer such that the hydroxyl groups can interact (e.g., by forming hydrogen and/or covalent bonds) with the silicon-containing surface.

In certain embodiments, a substrate including a plurality of lithographically derived trenches can be prepared using etching technology. For example, a substrate having a surface including a plurality of weirs can be prepared by the following method. A layer of thickness Y can be deposited on a substrate surface, and the layer can be selectively etched using lithographic techniques to form a topography of weirs and trenches.

Referring to FIG. 1, a substrate 10 has a plurality of weirs 30 of height Y, forming a surface topography of weirs 30 and trenches 40 of width $nL_o$, wherein n can be from 1 to 15. The plurality of trenches 40 (e.g., lithographically derived trenches) can be used as a guide for self-assembly of block copolymers as described herein. Referring to FIG. 2, block copolymer 100 having an inherent periodicity of $L_o$ can be deposited to form a layer of thickness less than or equal to Y within the plurality of trenches 40. Referring to FIG. 3, block copolymer 100 can then be annealed to allow the block copolymer to self-assemble and form within each trench a set of alternating lamellae 110 and 120 that are substantially perpendicular to the substrate surface and substantially in register with each trench sidewall 60. Lamellae 110 that include a first block of the self-assembled block copolymer can be crosslinked. Referring to FIGS. 3 and 4, at least a portion of material forming weirs 30 can be removed (e.g., using wet and/or dry etching methods) to form at least one opening 240 having a depth of Y'. Such openings 240 are referred to herein as "self-assembled copolymer" defined openings or trenches.

Figure 5:
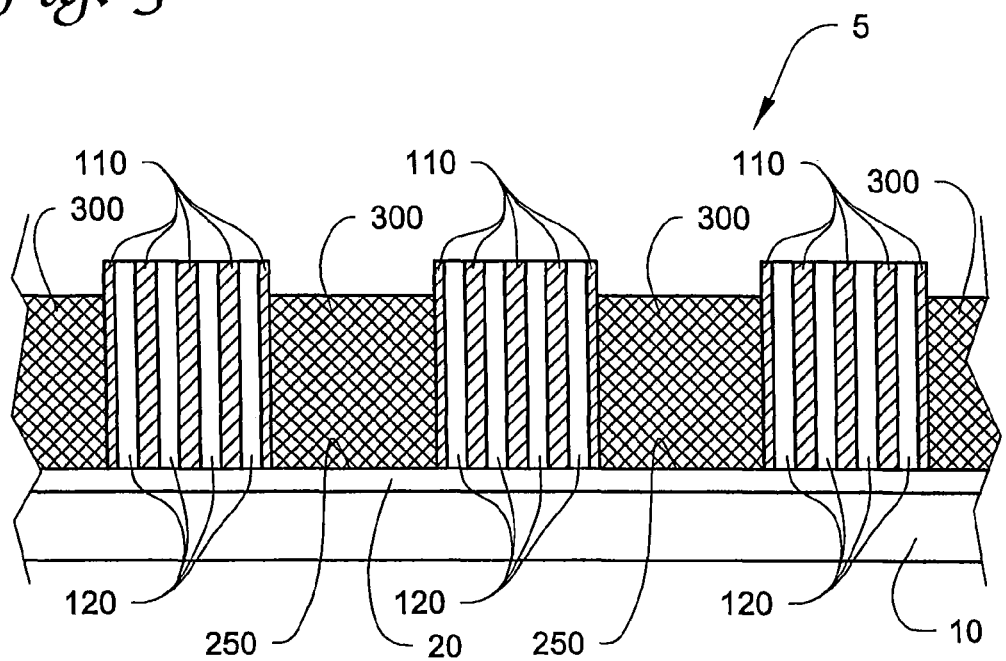
FIG. 5 is a view of the FIG. 4 substrate at a processing step subsequent to that shown in FIG. 4.
Figure 6:
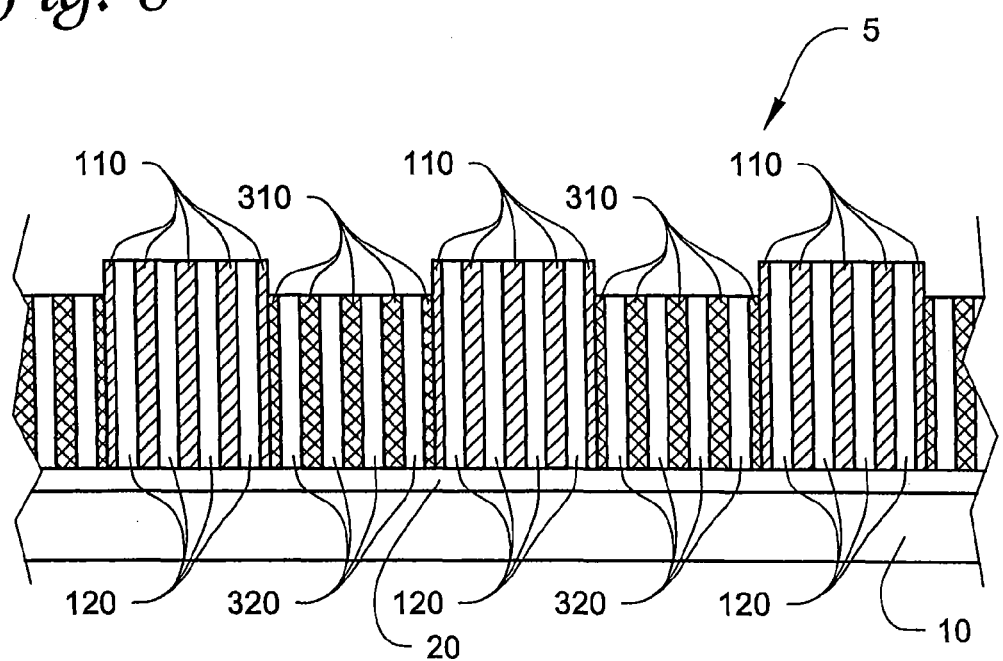
FIG. 6 is a view of the FIG. 5 substrate at a processing step subsequent to that shown in FIG. 5.

The self-assembled copolymer defined openings or trenches 240 can then be used as guides for self-assembly of block copolymers as described herein. The sidewalls 260 of such self-assembled copolymer defined openings 240 can be formed from lamellae 110 including the crosslinked block of block copolymer 100 used to define the openings. Referring to FIGS. 4 and 5, a second block copolymer 300, which can be the same as or different than block copolymer 100 used to define the openings, can then be deposited and annealed as described herein. In certain embodiments, the self-assembled copolymer defined opening can have a floor 250 that is neutral-wetting with respect to each block of second block copolymer 300; the self-assembled copolymer defined opening has two sidewalls 260 that are selectively wetted by one block of second block copolymer 300 (e.g., one block of second copolymer 300 is the same as or similar to the crosslinked block of first copolymer 100 that forms sidewalls 260 of the self-assembled copolymer defined openings 240); and the self-assembled copolymer defined openings 240 have a width of $mL'_o$, wherein m can be from 1 to 15, and $L'_o$ is the inherent periodicity of second block copolymer 300. Referring to FIGS. 5 and 6, in such embodiments, second block copolymer 300 can be annealed to allow second block copolymer 300 to self-assemble and form within each self-assembled copolymer defined opening 240, a second set of alternating lamellae 310 and 320 that can be substantially perpendicular to the substrate surface and substantially in register with each opening sidewall 260. FIGS. 4 to 6 illustrate an embodiment in which m=4 (i.e., the width of each trench 240 is $4L'_o$), and thus, 4 periods of lamellae are shown. However, as discussed herein above, m can be from 1 to 15, and accordingly from 1 to 15 periods of lamellae would result in these embodiments. Optionally, lamellae 310 that include a first block of self-assembled second block copolymer 300 can be crosslinked.

Figure 7:
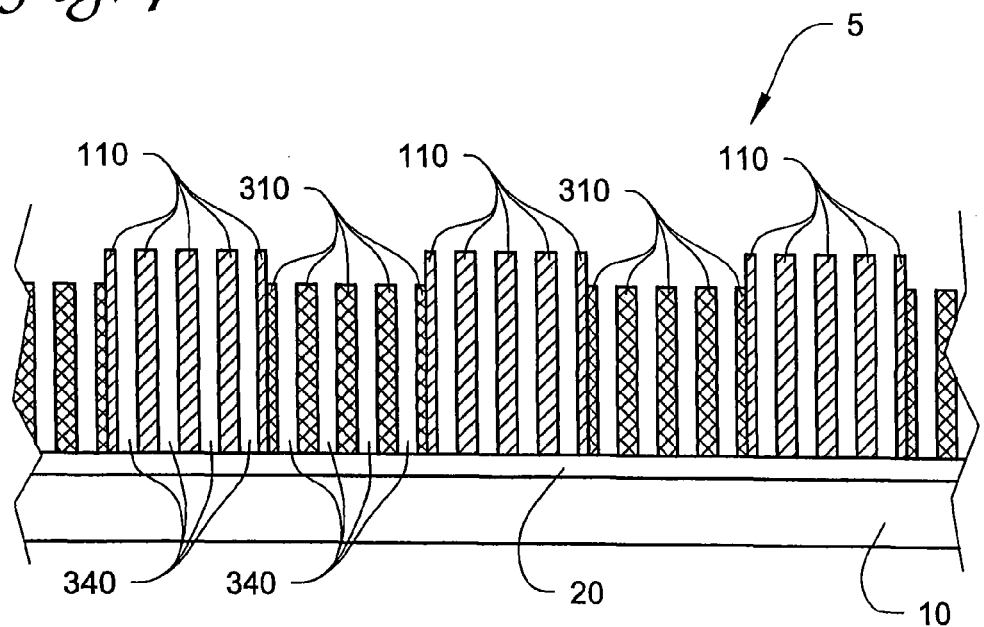
FIG. 7 is a view of the FIG. 6 substrate at a processing step subsequent to that shown in FIG. 6.

Referring to FIGS. 6 and 7, uncrosslinked lamellae 120 (i.e., from the first set of lamellae), uncrosslinked lamellae 320 (i.e., from the second set of lamellae), or in certain embodiments both, as illustrated in FIG. 7, can be removed by methods such as those described herein. Further, any remaining polymeric material can optionally be removed from the substrate, resulting in sub-lithographic trenches 340.

Referring to FIG. 7, the resulting pattern including the crosslinked lamellae 110 and 310 can be used, for example, as an etch mask to form sub-lithographic trenches in the substrate in register with sub-lithographic trenches 340. A conductive material can optionally be deposited into sub-lithographic trenches 340 to form sub-lithographic conductive lines. The conductive material can be a metal-containing material, which can be deposited, for example, by a vapor deposition method, e.g., chemical vapor deposition (CVD) or atomic layer deposition (ALD) method. Alternatively, the conductive material can be a conductive polymer and/or a metal-containing polymer composite, which can be deposited, for example, by spin coating, dip coating, spray coating, or combinations thereof. Alternatively, or in addition to, the resulting pattern including the crosslinked lamellae can be used, for example, as a deposition mask for depositing a material (e.g., a conductive or non-conductive material) on the substrate surface. In some embodiments, the resulting pattern including the crosslinked lamellae can include metal-containing lamellae that form conductive lines.

Figure 8:
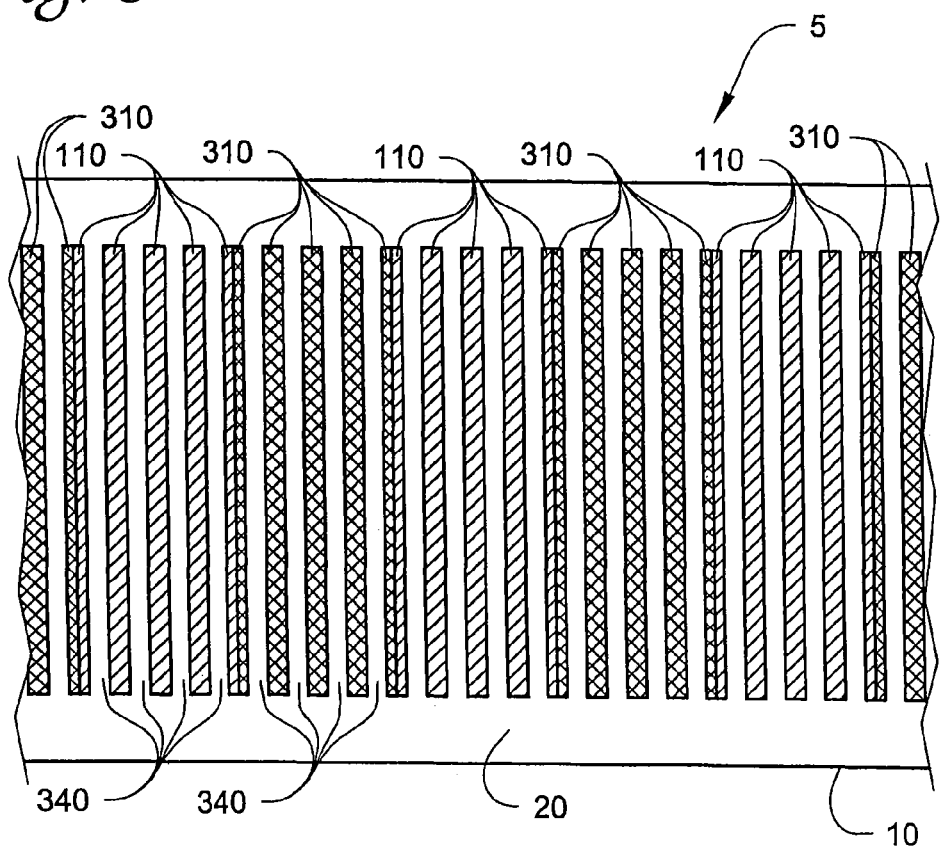
FIG. 8 is a top view of an example device or device component illustrating the patterned surface shown in FIG. 7.

FIG. 8 is a top view of device 5 as illustrated in FIG. 7, viewing down on the patterned surface of substrate 10, optionally having polymer mat or brush 20 thereon. Crosslinked lamellae 110 and 310 form openings to trenches 340. Thus, the resulting pattern including the crosslinked lamellae can be used, for example, as a deposition mask for depositing a material (e.g., a conductive or non-conductive material) on the substrate surface. Alternatively, or in addition to, crosslinked lamellae 110 and 310 can be used, for example, as an etch mask for etching the surface of substrate 10 in register with the openings to trenches 340 as described above. For example, in one embodiment the substrate surface can be etched using the crosslinked lamellae as an etch mask, any remaining polymeric material can optionally be removed, and conductive material (e.g., a metal-containing material, a conductive polymer, and/or a metal-containing polymer composite) can be deposited in the sub-lithographic trenches to form sub-lithographic conductive lines. In another embodiment, the substrate surface can be etched using the crosslinked lamellae as an etch mask, any remaining polymeric material can optionally be removed, and insulating material (e.g., non-conductive material having a high or low dielectric constant, and in certain embodiments a low dielectric constant to minimize capacitative coupling) can be deposited in the sub-lithographic trenches, for example, to isolate active areas from one another. Alternatively, for embodiments in which the crosslinked lamellae are metal-containing lamellae, the resulting structure can include conductive lines. One or more additional layers can optionally be provided to form a device in which the conductive lines are, for example, transistor gates.

One or more additional layers can be deposited to form a device, for example, wherein sub-lithographic conductive lines as described herein can be transistor gates.

The complete disclosures of the patents, patent documents, and publications cited herein are incorporated by reference in their entirety as if each were individually incorporated. Various modifications and alterations to the embodiments described herein will become apparent to those skilled in the art without departing from the scope and spirit of the present disclosure. It should be understood that this disclosure is not intended to be unduly limited by the illustrative embodiments and examples set forth herein and that such examples and embodiments are presented by way of example only with the scope of the disclosure intended to be limited only by the claims set forth herein as follows.

What is claimed is:

1. A method of patterning a substrate, comprising:
    forming weirs and trenches over a substrate, the weirs individually comprising a self assembled first block copolymer comprising a first set of alternating lamellae;
    forming a second block copolymer within the trenches; and
    self-assembling the second block copolymer within the trenches to form a second set of alternating lamellae within individual of the trenches.

2. The method of claim 1 wherein the first and second block copolymers are of the same composition.

3. The method of claim 1 wherein the first and second block copolymers are of different compositions.

4. The method of claim 1 wherein the weirs and trenches are formed to have substantially perpendicularly straight sidewalls.

5. The method of claim 1 wherein the second block copolymer is substantially symmetric.

6. The method of claim 1 wherein the second block copolymer prior to self-assembling has a thickness equal to or less than depth of the trenches.

7. The method of claim 6 wherein the second block copolymer prior to self-assembling has a thickness less than depth of the trenches.

8. The method of claim 1 wherein sidewalls of the trenches are selectively wetted by one block of the second block copolymer.

9. The method of claim 1 wherein floors of the trenches are neutral-wetting to each block of the second block copolymer.

10. The method of claim 1 wherein sidewalls of the trenches are selectively wetted by one block of the second block copolymer and floors of the trenches are neutral-wetting to each block of the second block copolymer.

11. The method of claim 1 comprising removing alternating lamellae of the first set and alternating lamellae of the second set to form openings where lamellae were removed.

12. The method of claim 1 comprising:
    removing alternating lamellae of the first set and alternating lamellae of the second set to form a mask over the substrate, the mask comprising mask openings where lamellae were removed; and
    using the mask with mask openings to etch a pattern of openings into the substrate under the mask.

13. The method of claim 1 comprising:
    removing alternating lamellae of the first set and alternating lamellae of the second set to form a mask over the substrate, the mask comprising mask openings where lamellae were removed; and
    depositing material into the mask openings.

14. The method of claim 13 wherein the material is conductive.

15. The method of claim 13 wherein the material is non-conductive.

16. The method of claim 1 wherein individual of the trenches have a width of $nL_0$, wherein "n" is from 1 to 15 and $L_0$ is an inherent periodicity of the second block copolymer.

17. The method of claim 16 wherein individual of the trenches are of constant width.

18. The method of claim 17 wherein the trenches are of the same constant width.

19. The method of claim 1 wherein the first set of alternating lamellae are of the same elevational thickness.

20. The method of claim 1 wherein the second set of alternating lamellae are of the same elevational thickness.

21. The method of claim 1 wherein the first set of alternating lamellae are of the same elevational thickness and the second set of alternating lamellae are of the same elevational thickness which is different from that of the first set of alternating lamellae.

22. The method of claim 21 wherein the elevational thickness of the second set of alternating lamellae is less than that of the first set of lamellae.

23. A method of patterning a substrate, comprising:
    forming first trenches in sacrificial material over a substrate;
    forming a first block copolymer within the first trenches;
    self-assembling the first block copolymer within the first trenches to form a first set of alternating lamellae within the first trenches;
    removing the sacrificial material to form second trenches over the substrate, the second trenches comprising sidewalls which comprise the self-assembled first block copolymer;
    forming a second block copolymer within the second trenches; and
    self-assembling the second block copolymer within the second trenches to form a second set of alternating lamellae within the second trenches.

* * * * *